(12) United States Patent
Toita et al.

(10) Patent No.: US 11,942,569 B2
(45) Date of Patent: Mar. 26, 2024

(54) METHODS AND PACKAGES FOR ENHANCING RELIABILITY OF ULTRAVIOLET LIGHT-EMITTING DEVICES

(71) Applicants: Masato Toita, Tokyo (JP); Satoshi Yamada, Tokyo (JP); Ken Kitamura, Tokyo (JP); Craig Moe, Latham, NY (US); Amy Miller, Ballston Lake, NY (US)

(72) Inventors: Masato Toita, Tokyo (JP); Satoshi Yamada, Tokyo (JP); Ken Kitamura, Tokyo (JP); Craig Moe, Latham, NY (US); Amy Miller, Ballston Lake, NY (US)

(73) Assignee: CRYSTAL IS, INC., Green Island, NY (US)

( * ) Notice: Subject to any disclaimer, the term of this patent is extended or adjusted under 35 U.S.C. 154(b) by 0 days.

(21) Appl. No.: 15/884,461

(22) Filed: Jan. 31, 2018

(65) Prior Publication Data
US 2018/0219124 A1  Aug. 2, 2018

Related U.S. Application Data

(60) Provisional application No. 62/568,350, filed on Oct. 5, 2017, provisional application No. 62/452,594, filed on Jan. 31, 2017.

(51) Int. Cl.
*H01L 33/06* (2010.01)
*H01L 31/0203* (2014.01)
(Continued)

(52) U.S. Cl.
CPC .......... *H01L 33/06* (2013.01); *H01L 31/0203* (2013.01); *H01L 33/32* (2013.01);
(Continued)

(58) Field of Classification Search
CPC ... H01L 25/167; H01L 31/0203; H01L 33/06; H01L 33/32; H01L 33/405; H01L 33/486; H01L 33/56; H01L 33/58; H01L 33/648
See application file for complete search history.

(56) References Cited

U.S. PATENT DOCUMENTS

5,099,311 A * 3/1992 Bonde ...................... F28F 3/12
165/80.4
5,585,671 A * 12/1996 Nagesh ................. H01L 23/367
257/713
(Continued)

FOREIGN PATENT DOCUMENTS

JP  2011035198  2/2011
JP  2014100206  6/2014
(Continued)

OTHER PUBLICATIONS

International Search Report, for International Application No. PCT/US2018/016066, dated May 18, 2018, 23 pages.

*Primary Examiner* — Britt D Hanley
*Assistant Examiner* — Kevin Quinto
(74) *Attorney, Agent, or Firm* — Morgan, Lewis & Bockius LLP

(57) ABSTRACT

In various embodiments, degradation of epoxy within packages for ultraviolet light-emitting devices is reduced or substantially eliminated via package venting, prevention of transmission of ultraviolet light to one or more regions of epoxy utilized in the package, and/or utilization of packaging schemes that reduce or avoid utilization of epoxy and/or specific metals.

32 Claims, 17 Drawing Sheets

(51) Int. Cl.
    H01L 33/32      (2010.01)
    H01L 33/40      (2010.01)
    H01L 33/48      (2010.01)
    H01L 33/58      (2010.01)
    H01L 33/64      (2010.01)
    H01L 25/16      (2023.01)
    H01L 33/56      (2010.01)
(52) U.S. Cl.
    CPC .......... *H01L 33/405* (2013.01); *H01L 33/486* (2013.01); *H01L 33/58* (2013.01); *H01L 33/648* (2013.01); H01L 25/167 (2013.01); H01L 33/56 (2013.01)

(56) References Cited

U.S. PATENT DOCUMENTS

| | | | | |
|---|---|---|---|---|
| 5,591,680 A * | 1/1997 | Tuttle | ............... | C23C 14/0676 204/192.23 |
| 5,731,631 A * | 3/1998 | Yama | ............... | H01L 21/56 257/702 |
| 5,818,094 A * | 10/1998 | Matsuo | ............... | H01L 23/145 257/434 |
| 6,744,131 B1 * | 6/2004 | Hoang | ............... | H01L 23/04 257/678 |
| 8,242,475 B1 * | 8/2012 | Cheng | ............... | A45D 29/00 118/620 |
| 8,710,721 B1 * | 4/2014 | Li | ............... | F21V 29/83 362/345 |
| 2002/0118518 A1 * | 8/2002 | Orcutt | ............... | H05K 1/14 361/748 |
| 2004/0041159 A1 * | 3/2004 | Yuri | ............... | H01L 24/24 257/79 |
| 2005/0098872 A1 * | 5/2005 | Lien | ............... | H01L 23/3114 257/692 |
| 2007/0131954 A1 * | 6/2007 | Murayama | ............... | H01L 33/648 257/98 |
| 2008/0142822 A1 * | 6/2008 | Kim | ............... | H01L 33/54 257/E33.059 |
| 2009/0200063 A1 * | 8/2009 | Omerovic | ............... | H01T 4/08 174/250 |
| 2012/0026720 A1 * | 2/2012 | Cho | ............... | G02F 1/133606 362/84 |
| 2012/0267671 A1 * | 10/2012 | Jung | ............... | H01L 33/486 257/99 |
| 2013/0135823 A1 * | 5/2013 | Kim | ............... | H01L 23/043 361/697 |
| 2014/0183570 A1 * | 7/2014 | Shen | ............... | F21V 29/006 257/88 |
| 2014/0203311 A1 * | 7/2014 | Schowalter | ............... | H01L 33/405 438/27 |
| 2014/0264395 A1 * | 9/2014 | Lee | ............... | H01L 27/15 257/88 |
| 2014/0292182 A1 * | 10/2014 | Kung | ............... | F21V 29/506 313/317 |
| 2015/0014711 A1 * | 1/2015 | Bergenek | ............... | H01L 33/40 257/88 |
| 2015/0016072 A1 * | 1/2015 | Iwayama | ............... | H05K 1/036 430/319 |
| 2015/0287894 A1 * | 10/2015 | Toita | ............... | H01L 33/58 257/98 |
| 2016/0172553 A1 | 6/2016 | Toita et al. | | |
| 2017/0084803 A1 * | 3/2017 | Iwaki | ............... | H01L 27/0248 |
| 2017/0200867 A1 * | 7/2017 | Chien | ............... | H01L 33/486 |

FOREIGN PATENT DOCUMENTS

KR          1020120122734          11/2012
KR          1020140132516          11/2014

* cited by examiner

METHODS AND PACKAGES FOR ENHANCING RELIABILITY OF ULTRAVIOLET LIGHT-EMITTING DEVICES

RELATED APPLICATIONS

This application claims the benefit of and priority to U.S. Provisional Patent Application No. 62/452,594, filed Jan. 31, 2017, and U.S. Provisional Patent Application No. 62/568,350, filed Oct. 5, 2017, the entire disclosure of each of which is hereby incorporated herein by reference.

TECHNICAL FIELD

In various embodiments, the present invention relates to light emitters emitting ultraviolet (UV) radiation.

BACKGROUND

Light-emitting diodes (LEDs) are increasingly utilized in a variety of different lighting applications due to their lower energy consumption, longer lifetime, high physical robustness, small size, and fast switching times. In a conventional LED package, the LED chip is electrically and physically mounted on a surface-mount device (SMD) package, which is typically sealed (e.g., with a transparent lid) to protect the device against contamination or other environmental effects.

UV LEDs have shown great promise for applications such as medical therapy, sensors and instrumentation, and fluid sterilization. Unfortunately, the above-described conventional packaging may be problematic for UV LEDs, which may emit light having wavelengths less than 320 nm, less than 265 nm, less than 230 nm, or even less than 200 nm. The highly energetic UV light emitted by UV LEDs may attack or deteriorate various materials utilized in conventional LED packaging, and the degradation and/or reaction of those materials may impact the integrity and/or reliability of the device during its intended operational lifetime. Thus, there is a need for improved packaging schemes for UV LEDs that enable high reliability, mechanical robustness, and long lifetime for the packaged devices.

SUMMARY

In accordance with various embodiments of the present invention, packaging schemes for UV light-emitting devices are utilized in order to reduce or substantially eliminate the effects of deterioration of epoxy utilized within the package caused by the UV light emitted by the UV light-emitting chip or die. In various embodiments, the package is vented in order to provide an outlet for gaseous by-products of the degradation of the epoxy, thereby preventing further deleterious chemical reactions within the package. In other embodiments, UV light from the light-emitter is prevented from propagating to, and therefore causing degradation of, the epoxy utilized to attach the lid to the package and/or to mount other electronic components (e.g., voltage regulators such as zener diodes) within the package. For example, regions of the epoxy may be sealed against exposure to the UV light by a UV-opaque encapsulant material or other UV-opaque shield. As utilized herein, an "opaque" material substantially does not transmit light of a particular wavelength or wavelength range (e.g., UV light), and instead is reflective and/or strongly absorptive (e.g., over a small thickness) to light of the particular wavelength or wavelength range. In this manner, embodiments of the invention include packaged UV light-emitting devices having long lifetimes, high output power, and high reliability. As utilized herein, a material that is "transparent" (e.g., to UV light) is not necessarily visibly clear or 100% transparent to UV and/or visible light; rather, such transparent materials in various embodiments of the invention have a transmittance (e.g., to UV light and/or to other wavelengths of light such as visible light) of at least 60%, at least 70%, at least 80%, at least 90%, at least 95%, at least 98%, or at least 99%. It should be understood that package materials (e.g., lids or other package portions) described as transparent are transparent with regard to one or more (or even all) wavelengths or wavelength ranges emitted by light-emitting devices enclosed or disposed in such packages.

In various embodiments of the invention, the light-emitting device may include, consist essentially of, or consist of a light-emitting diode (e.g., a bare-die light-emitting diode or light-emitting diode chip) or a laser (e.g., a bare-die laser or laser chip). The UV light emitted by the light-emitting device may have a wavelength of 265 nm or less, 230 nm or less, or even 200 nm or less. The light-emitting device may have disposed thereon a lens that may include, consist essentially of, or consist of quartz, fused silica, and/or sapphire, for example as described in U.S. patent application Ser. No. 14/679,655, filed Apr. 6, 2015, the entire disclosure of which is incorporated herein by reference.

Although examples of embodiments of the invention described herein utilize light-emitting devices configured to emit UV light, various embodiments of the invention may be utilized with light-emitting devices configured to emit other wavelengths of light, e.g., visible light or infrared light. As utilized herein, a "metallization pattern" typically includes multiple discrete and separate metal regions utilized as, for example, contacts to different electrodes of a light-emitting device and/or a voltage regulator; however, in various embodiments of the invention a metallization pattern may feature only one such metal region.

In an aspect, embodiments of the invention feature an illumination device that includes, consists essentially of, or consists of a package, a light-emitting device, a first epoxy, a metallization pattern, and a hollow vent. The package includes, consists essentially of, or consists of (i) a base defining a recessed interior volume and (ii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. The first epoxy seals the lid to the base. (As utilized herein, "sealing" the lid to the base means attaching the lid to the base at one or more points and does not necessarily imply formation of a hermetic seal.) The metallization pattern is disposed on the base and is electrically coupled to the light-emitting device. The hollow vent fluidly couples the interior volume with the exterior environment. The hollow vent is through and/or defined in the base, the lid, and/or the first epoxy.

Embodiments of the invention may include one or more of the following in any of a variety of combinations. The vent may include, consist essentially of, or consist of one or more holes through the lid and/or defined in the lid. The first epoxy may seal the lid to the base at two or more discrete points. The vent may be disposed between the two or more discrete points. The vent may include, consist essentially of, or consist of one or more holes through the base and/or defined in the base. The illumination device may include one or more voltage-regulation devices. The one or more voltage-regulation devices may be disposed within the interior volume. The one or more voltage-regulation devices may be electrically coupled to the metallization pattern. At least one of the voltage-regulation devices may include, consist essentially of, or consist of a zener diode. The illumination device may include a second epoxy in contact with one or more of the voltage-regulation devices. The second epoxy may attach at least one of the voltage-regulation devices to the base. A barrier material may be disposed over the second epoxy. The barrier material may substantially prevent propagation of light (e.g., UV light) emitted by the light-emitting device to the second epoxy. The barrier material may include, consist essentially of, or consist of an encapsulant that is opaque to the light emitted by the light-emitting device (e.g., UV light).

A barrier material may be disposed between the first epoxy and the interior volume. The barrier material may substantially prevent propagation of light emitted by the light-emitting device (e.g., UV light) to the first epoxy. The barrier material may include, consist essentially of, or consist of one or more metals and/or polytetrafluoroethylene. The metallization pattern may include, consist essentially of, or consist of Ni. The metallization pattern may be substantially free of Ni. The base may be shaped to define the vent between the lid and the base when the lid is sealed to the base. The light-emitting device may include, consist essentially of, or consist of a light-emitting diode or a laser.

In another aspect, embodiments of the invention feature an illumination device that includes, consists essentially of, or consists of a package, a light-emitting device, a first epoxy, and a metallization pattern. The package includes, consists essentially of, or consists of (i) a base defining a recessed interior volume and (ii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. The first epoxy seals the lid to the base. The metallization pattern is disposed on the base and is electrically coupled to the light-emitting device. The interior volume contains therewithin oxygen at a concentration lower than that within the environment external to the illumination device. The interior volume may be substantially free of oxygen. (In various embodiments, "substantially free of oxygen" means containing less than 1% oxygen, less than 0.5% oxygen, or less than 0.1% oxygen. In various embodiments, "substantially free of oxygen" means containing oxygen at a sufficiently low concentration such that deleterious reactions described herein (e.g., formation of nickel-containing regions) do not occur at a rate sufficient to impact the efficiency of the illumination device over an operating period of, e.g., 1000 hours, 5000 hours, 10,000 hours, or 50,000 hours.)

Embodiments of the invention may include one or more of the following in any of a variety of combinations. The pressure within the interior volume may be less than atmospheric pressure. The interior volume (i.e., the portion of the interior volume not occupied by the light-emitting device and the other elements of the illumination device) may be substantially filled with nitrogen and/or one or more inert gases. A composition of gas within the interior volume may be different from that of atmospheric air disposed outside of the illumination device. The illumination device may include one or more voltage-regulation devices. The one or more voltage-regulation devices may be disposed within the interior volume. The one or more voltage-regulation devices may be electrically coupled to the metallization pattern. At least one of the voltage-regulation devices may include, consist essentially of, or consist of a zener diode. The illumination device may include a second epoxy in contact with one or more of the voltage-regulation devices. The second epoxy may attach at least one of the voltage-regulation devices to the base. A barrier material may be disposed over the second epoxy. The barrier material may substantially prevent propagation of light (e.g., UV light) emitted by the light-emitting device to the second epoxy. The barrier material may include, consist essentially of, or consist of an encapsulant that is opaque to the light emitted by the light-emitting device (e.g., UV light).

A barrier material may be disposed between the first epoxy and the interior volume. The barrier material may substantially prevent propagation of light emitted by the light-emitting device (e.g., UV light) to the first epoxy. The barrier material may include, consist essentially of, or consist of one or more metals and/or polytetrafluoroethylene. The metallization pattern may include, consist essentially of, or consist of Ni. The metallization pattern may be substantially free of Ni. The light-emitting device may include, consist essentially of, or consist of a light-emitting diode or a laser.

In yet another aspect, embodiments of the invention feature an illumination device that includes, consists essentially of, or consists of a package, a light-emitting device, a first epoxy, a metallization pattern, and a barrier material. The package includes, consists essentially of, or consists of (i) a base defining a recessed interior volume and (ii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. The first epoxy seals the lid to the base. The metallization pattern is disposed on the base and is electrically coupled to the light-emitting device. The barrier material is disposed between the first epoxy and the interior volume. The barrier material substantially prevents propagation of light emitted by the light-emitting device (e.g., UV light) to the first epoxy.

Embodiments of the invention may include one or more of the following in any of a variety of combinations. The barrier material may include, consist essentially of, or consist of one or more metals and/or polytetrafluoroethylene. The metallization pattern may include, consist essentially of, or consist of Ni. The metallization pattern may be substantially free of Ni. The light-emitting device may include, consist essentially of, or consist of a light-emitting diode or a laser. The illumination device may include one or more voltage-regulation devices. The one or more voltage-regulation devices may be disposed within the interior volume. The one or more voltage-regulation devices may be electrically coupled to the metallization pattern. At least one of the voltage-regulation devices may include, consist essentially of, or consist of a zener diode. The illumination device may include a second epoxy in contact with one or more of the voltage-regulation devices. The second epoxy may attach at least one of the voltage-regulation devices to the base. A second barrier material may be disposed over the second epoxy. The second barrier material may substantially prevent propagation of light (e.g., UV light) emitted by the light-emitting device to the second epoxy. The second barrier material may include, consist essentially of, or consist of an encapsulant that is opaque to the light emitted by the light-emitting device (e.g., UV light).

In another aspect, embodiments of the invention feature an illumination device that includes, consists essentially of, or consists of a package, a light-emitting device, a metallization pattern, one or more voltage-regulation devices, a first epoxy, and a barrier material. The package includes, consists essentially of, or consists of (i) a base defining a recessed interior volume and (ii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. The metallization pattern is disposed on the base and is electrically coupled to the light-emitting device. At least one of the voltage-regulation devices is disposed within the interior volume. One or more of the voltage-regulation devices may be electrically coupled to the metallization pattern. The first epoxy is in contact with one or more of the voltage-regulation devices. The first epoxy may attach one or more of the voltage-regulation devices within the interior volume. The first epoxy may attach one or more of the voltage-regulation devices to the base. The barrier material is disposed over the first epoxy. The barrier material substantially prevents propagation of light (e.g., UV light) emitted by the light-emitting device to the first epoxy.

Embodiments of the invention may include one or more of the following in any of a variety of combinations. The barrier material may include, consist essentially of, or consist of an encapsulant that is opaque to the light emitted by the light-emitting device (e.g., UV light). The metallization pattern may include, consist essentially of, or consist of Ni. The metallization pattern may be substantially free of Ni. The light-emitting device may include, consist essentially of, or consist of a light-emitting diode or a laser.

In yet another aspect, embodiments of the invention feature an illumination device that includes, consists essentially of, or consists of a package, a light-emitting device, a first epoxy, and a barrier material. The package includes, consists essentially of, or consists of (i) a base defining a recessed interior volume and (ii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. The first epoxy seals the lid to the base. The barrier material is disposed between the first epoxy and the lid. The barrier material substantially prevents propagation of light emitted by the light-emitting device (e.g., UV light) within and/or through the lid to the first epoxy.

Embodiments of the invention may include one or more of the following in any of a variety of combinations. The barrier material may include, consist essentially of, or consist of one or more metals (e.g., aluminum) and/or polytetrafluoroethylene. At least a portion of the barrier material may be in the form of a film disposed on a surface of the lid (e.g., a top surface and/or a bottom surface). The surface of the lid may face the first epoxy. The illumination device may include a metallization pattern electrically coupled to the light-emitting device. At least a portion of the metallization pattern may be disposed within the interior volume (e.g., on the base). The metallization pattern may include, consist essentially of, or consist of Ni. The metallization pattern may be substantially free of Ni. The illumination device may include one or more voltage-regulation devices. The one or more voltage-regulation devices may be disposed within the interior volume. The one or more voltage-regulation devices may be electrically coupled to the metallization pattern. At least one of the voltage-regulation devices may include, consist essentially of, or consist of a zener diode. The illumination device may include a second epoxy in contact with one or more of the voltage-regulation devices. The second epoxy may attach at least one of the voltage-regulation devices to the base. A second barrier material may be disposed over the second epoxy. The second barrier material may substantially prevent propagation of light (e.g., UV light) emitted by the light-emitting device to the second epoxy. The second barrier material may include, consist essentially of, or consist of an encapsulant that is opaque to the light emitted by the light-emitting device (e.g., UV light). The light-emitting device may include, consist essentially of, or consist of a light-emitting diode or a laser.

In another aspect, embodiments of the invention feature an illumination device that includes, consists essentially of, or consists of a package and a light-emitting device. The package includes, consists essentially of, or consists of (i) a base defining a recessed interior volume and (ii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. An edge of the lid is received within a recessed groove defined in the sidewall such that the sidewall wraps around and/or surrounds at least portions of the top, bottom, and side surfaces of the edge of the lid.

Embodiments of the invention may include one or more of the following in any of a variety of combinations. The package and/or the interior volume may be substantially free of epoxy. An epoxy may at least partially seal the edge of the lid to the groove in the sidewall. A barrier material may be disposed between the epoxy and the interior volume. The barrier material may substantially prevent propagation of light emitted by the light-emitting device (e.g., UV light) to the epoxy. The barrier material may include, consist essentially of, or consist of one or more metals (e.g., aluminum) and/or polytetrafluoroethylene. The illumination device may include a metallization pattern electrically coupled to the light-emitting device. At least a portion of the metallization pattern may be disposed within the interior volume (e.g., on the base). The metallization pattern may include, consist essentially of, or consist of Ni. The metallization pattern may be substantially free of Ni. The illumination device may include one or more voltage-regulation devices. The one or more voltage-regulation devices may be disposed within the interior volume. The one or more voltage-regulation devices may be electrically coupled to the metallization pattern. At least one of the voltage-regulation devices may include, consist essentially of, or consist of a zener diode. The illumination device may include a second epoxy in contact with one or more of the voltage-regulation devices. The second epoxy may attach at least one of the voltage-regulation devices to the base. A second barrier material may be disposed over the second epoxy. The second barrier material may substantially prevent propagation of light (e.g., UV light) emitted by the light-emitting device to the second epoxy. The second barrier material may include, consist essentially of, or consist of an encapsulant that is opaque to the light emitted by the light-emitting device (e.g., UV light). The light-emitting device may include, consist essentially of, or consist of a light-emitting diode or a laser.

In yet another aspect, embodiments of the invention feature an illumination device that includes, consists essentially of, or consists of a package, a light-emitting device, and one or more corner clips. The package includes, consists essentially of, or consists of (i) a base defining a recessed interior volume and (ii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. At least a portion of each corner clip is disposed over a portion of an edge of the lid for securing the lid over the sidewall of the package.

Embodiments of the invention may include one or more of the following in any of a variety of combinations. At least a portion of at least one of the corner clips is defined by a portion of the sidewall. At least one of the corner clips urges the lid toward the sidewall of the package (e.g., downward toward the base). At least a portion of at least one of the corner clips includes, consists essentially of, or consists of a spring. At least one of the corner clips may be spring-loaded. At least one of the corner clips may be discrete from and disposed on or over (e.g., bonded to) the package (e.g., the sidewall of the package). At least a portion of at least one of the corner clips includes, consists essentially of, or consists of one or more metals. An epoxy may at least partially seal the edge of the lid to the package (e.g., to the sidewall). A barrier material may be disposed between the epoxy and the interior volume. The barrier material may substantially prevent propagation of light emitted by the light-emitting device (e.g., UV light) to the epoxy. The barrier material may include, consist essentially of, or consist of one or more metals (e.g., aluminum) and/or polytetrafluoroethylene.

The illumination device may include a metallization pattern electrically coupled to the light-emitting device. At least a portion of the metallization pattern may be disposed within the interior volume (e.g., on the base). The metallization pattern may include, consist essentially of, or consist of Ni. The metallization pattern may be substantially free of Ni. The illumination device may include one or more voltage-regulation devices. The one or more voltage-regulation devices may be disposed within the interior volume. The one or more voltage-regulation devices may be electrically coupled to the metallization pattern. At least one of the voltage-regulation devices may include, consist essentially of, or consist of a zener diode. The illumination device may include a second epoxy in contact with one or more of the voltage-regulation devices. The second epoxy may attach at least one of the voltage-regulation devices to the base. A second barrier material may be disposed over the second epoxy. The second barrier material may substantially prevent propagation of light (e.g., UV light) emitted by the light-emitting device to the second epoxy. The second barrier material may include, consist essentially of, or consist of an encapsulant that is opaque to the light emitted by the light-emitting device (e.g., UV light). The light-emitting device may include, consist essentially of, or consist of a light-emitting diode or a laser.

In another aspect, embodiments of the invention feature an illumination device that includes, consists essentially of, or consists of a package, a light-emitting device, and a glass-to-metal seal. The package includes, consists essentially of, or consists of (i) a base, (ii) a sidewall disposed over the base, the base and the sidewall collectively defining a recessed interior volume, and (iii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. The glass-to-metal seal secures an edge of the lid to the sidewall. The sidewall includes, consists essentially of, is at least partially coated with, or consists of a metallic material.

Embodiments of the invention may include one or more of the following in any of a variety of combinations. The metallic material may include, consist essentially of, or consist of aluminum. The base may include, consist essentially of, or consist of a second metallic material. At least a portion of the second metallic material may include, consist essentially of, or consist of a metal different from that of the metallic material. At least a portion of the base may include, consist essentially of, or consist of a non-metallic material (e.g., a ceramic material). The illumination device may include a metallization pattern electrically coupled to the light-emitting device. At least a portion of the metallization pattern may be disposed within the interior volume (e.g., on the base). The metallization pattern may include, consist essentially of, or consist of Ni. The metallization pattern may be substantially free of Ni. The illumination device may include one or more voltage-regulation devices. The one or more voltage-regulation devices may be disposed within the interior volume. The one or more voltage-regulation devices may be electrically coupled to the metallization pattern. At least one of the voltage-regulation devices may include, consist essentially of, or consist of a zener diode. The illumination device may include an epoxy in contact with one or more of the voltage-regulation devices. The epoxy may attach at least one of the voltage-regulation devices to the base. A barrier material may be disposed over the epoxy. The barrier material may substantially prevent propagation of light (e.g., UV light) emitted by the light-emitting device to the epoxy. The barrier material may include, consist essentially of, or consist of an encapsulant that is opaque to the light emitted by the light-emitting device (e.g., UV light). The light-emitting device may include, consist essentially of, or consist of a light-emitting diode or a laser.

In yet another aspect, embodiments of the invention feature an illumination device that includes, consists essentially of, or consists of a package, a light-emitting device, a first epoxy, and a metallization pattern. The package includes, consists essentially of, or consists of (i) a base defining a recessed interior volume and (ii) a transparent lid disposed over the base and at least partially enclosing and/or covering the interior volume. The light-emitting device is disposed within the interior volume. The light-emitting device may be configured to emit ultraviolet (UV) light. The light-emitting device may be configured to emit visible or infrared light. The first epoxy seals the lid to the base. The metallization pattern is disposed on the base and is electrically coupled to the light-emitting device. The metallization pattern and the interior volume are substantially free of Ni (e.g., a concentration of Ni therein is less than 0.5%, less than 0.1%, less than 0.05%, less than 0.01%, less than 0.001%, and/or present only in trace amounts as an impurity rather than deliberately introduced within the metallization pattern or the interior volume).

Embodiments of the invention may include one or more of the following in any of a variety of combinations. The interior volume may contain therewithin oxygen at a concentration lower than that within the environment external to the illumination device. The interior volume may be substantially free of oxygen. The pressure within the interior volume may be less than atmospheric pressure. The interior volume (i.e., the portion of the interior volume not occupied by the light-emitting device and the other elements of the illumination device) may be substantially filled with nitrogen and/or one or more inert gases. A composition of gas within the interior volume may be different from that of atmospheric air disposed outside of the illumination device. The illumination device may include one or more voltage-regulation devices. The one or more voltage-regulation devices may be disposed within the interior volume. The one or more voltage-regulation devices may be electrically coupled to the metallization pattern. At least one of the voltage-regulation devices may include, consist essentially of, or consist of a zener diode. The illumination device may include a second epoxy in contact with one or more of the voltage-regulation devices. The second epoxy may attach at least one of the voltage-regulation devices to the base. A barrier material may be disposed over the second epoxy. The barrier material may substantially prevent propagation of light (e.g., UV light) emitted by the light-emitting device to the second epoxy. The barrier material may include, consist essentially of, or consist of an encapsulant that is opaque to the light emitted by the light-emitting device (e.g., UV light). A barrier material may be disposed between the first epoxy and the interior volume. The barrier material may substantially prevent propagation of light emitted by the light-emitting device (e.g., UV light) to the first epoxy. The barrier material may include, consist essentially of, or consist of one or more metals and/or polytetrafluoroethylene. The light-emitting device may include, consist essentially of, or consist of a light-emitting diode or a laser.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially," "about," and "approximately" mean±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
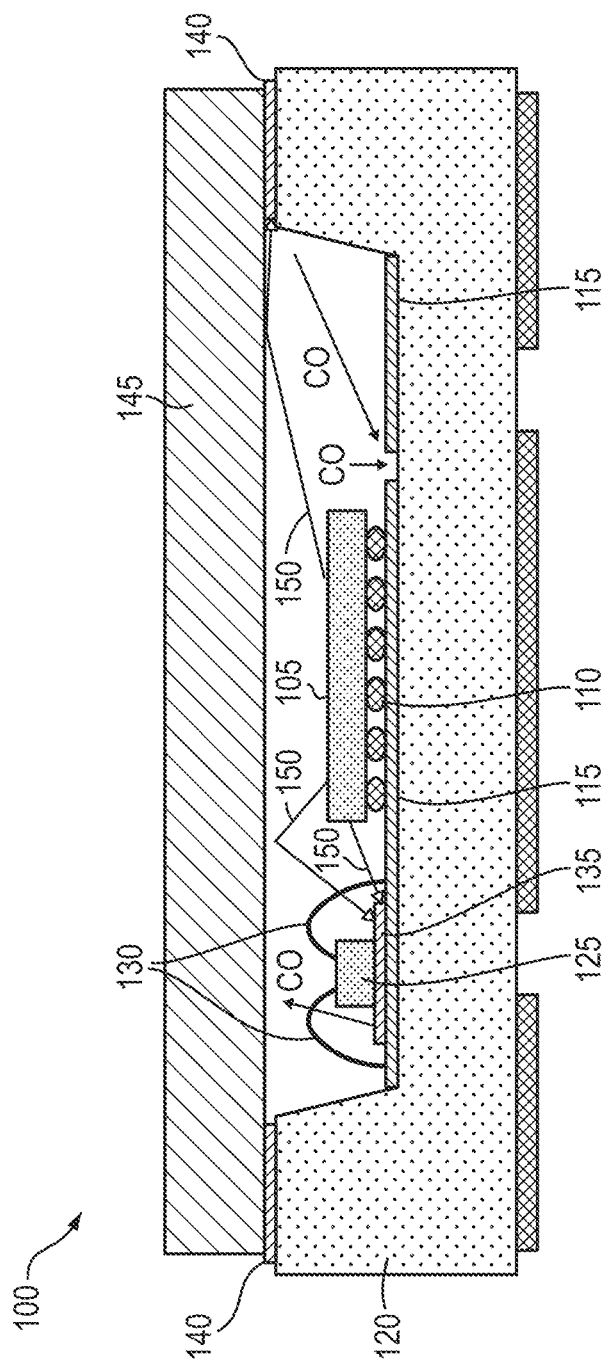
FIG. 1 is a cross-sectional schematic of a packaged UV light-emitting device in accordance with various embodiments of the invention.

FIG. 1 is an illustration of a potential degradation mechanism encountered and at least partially alleviated in various embodiments of the present invention. FIG. 1 depicts a cross-sectional view of a packaged UV light-emitting device 100 in which a light-emitting die 105 is bump-bonded (e.g., via ball-bonds 110, which may include, consist essentially of, or consist of, e.g., gold) to package metallization 115 disposed along the interior base of a package (or "submount") 120. The light-emitting die 105 may include, consist essentially of, or consist of, for example, one or more LEDs and/or lasers. In various embodiments, the metallization 115 includes, consists essentially of, or consists of a multilayer structure, e.g., Au/NiP/W. In various embodiments, at least a portion of, or at least one layer of, the metallization 115 includes, consists essentially of, or consists of Ni. In various embodiments of the invention, the metallization 115 includes, consists essentially of, or consists of, for example, Ni/Pd/Au, Ni/Pd/Cu, or an alloy containing Ni (e.g., approximately 29% Ni, approximately 17% Co, and approximately 54% Fe). In addition, one or more voltage regulators 125 are disposed within the package 120 and electrically connected to the metallization 115 via, e.g., one or more wire bonds 130 and mechanically fastened within the package 120 by epoxy 135 (e.g., an epoxy based on bisphenol A and epichlorohydrin or one or more epoxy resins). An epoxy 140 (which may be substantially the same as, or a compound different from, the epoxy 135) may be utilized to fasten a transparent lid 145 (which may for example, include, consist essentially of, or consist of quartz, sapphire, glass, or another material substantially transparent to UV light) onto the SMD package 120, thereby isolating the interior of the package 120 from the surrounding environment. The voltage regulator 125, which may include, consist essentially of, or consist of, for example, one or more zener diodes, is typically utilized to protect the light-emitting die 105 from short circuits or electrostatic discharge (ESD) events. In various embodiments, the voltage regulator 125 may include, consist essentially of, or consist of one or more avalanche breakdown diodes and/or one or more silicon controlled rectifiers. In various embodiments, the voltage regulator 125 may include, consist essentially of, or consist of a resistor and one or more diodes; for example, the resistor may be electrically connected in series with the one or more diodes.

The package 120 may include, consist essentially of, or consist of, for example, one or more plastics such as polyphthalamide (PPA) and/or one or more ceramics such as aluminum nitride and/or alumina. In various embodiments, one or more surfaces (or even the entirety) of the package 120 (which may be, e.g., an SMD package) may be coated with a material reflective to UV light (e.g., aluminum or PTFE). For example, the inner surface of package 120, i.e., the surface facing the UV light-emitting die 105, may be coated with aluminum formed by, e.g., non-electrolytic plating.

The UV light-emitting die 105 may include an AlN substrate and, thereover, one or more quantum wells and/or strained layers including or consisting essentially of AlN, GaN, InN, or any binary or tertiary alloy thereof. In various embodiments, UV light-emitting die 105 includes a substrate and/or device structure resembling those detailed in U.S. Pat. No. 7,638,346, filed on Aug. 14, 2006, U.S. Pat. No. 8,080,833, filed on Apr. 21, 2010, and/or U.S. Patent Application Publication No. 2014/0264263, filed on Mar. 13, 2014, the entire disclosure of each of which is incorporated by reference herein.

Unfortunately, as shown in FIG. 1, UV light 150 emitted by the light-emitting die 105 can propagate to and attack the epoxy 135, 140 utilized for attachment of the lid 145 and the voltage regulator 125. As the epoxy 135, 140 is exposed to the UV light 150, carbon dioxide ($CO_2$) may be produced, and, as oxygen is depleted within the package 120, carbon monoxide (CO) may also be produced via a photochemical reaction similar to incomplete combustion. The inventors of the present invention have verified the presence of $CO_2$ within LED packages in accordance with embodiments of the invention via residual gas analysis; detection of CO via mass spectroscopy was not possible since its mass number (28) matches that of the more abundant nitrogen gas ($N_2$). As shown in FIG. 1, as CO is produced, the CO attacks the Ni within the package metallization 115, particularly at exposed edges of the electrode pattern (e.g., between electrodes or in gaps in the electrode pattern).

Figure 2:
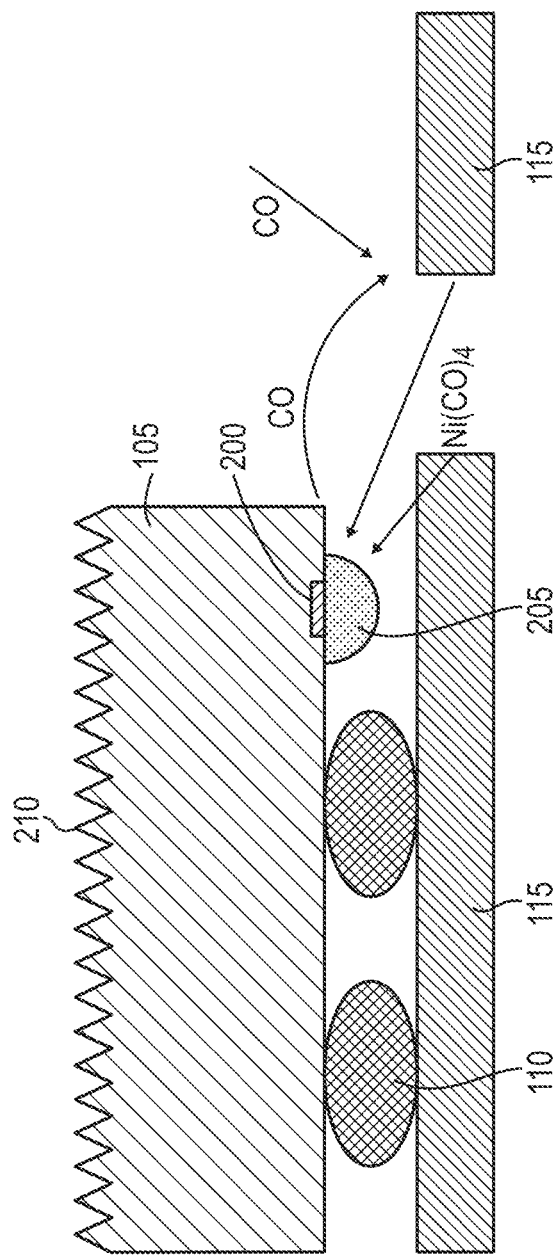
FIG. 2 is a magnified cross-sectional schematic of a portion of the device of FIG. 1 in accordance with various embodiments of the invention.

FIG. 2 depicts an enlarged portion of the bonded UV light-emitting die 105 within the package 120 depicted in FIG. 1. In accordance with various embodiments, the CO within the package 120 reacts with the Ni within the package metallization 115 to form nickel carbonyl at temperatures of, for example, 50° C.-60° C.:

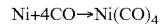

$$Ni+4CO \rightarrow Ni(CO)_4$$

As the temperature within the package 120 increases (for example, during continued operation of the light-emitting die 105), the nickel carbonyl decomposes to form metallic Ni:

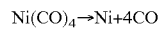

$$Ni(CO)_4 \rightarrow Ni+4CO$$

As shown in FIG. 2, the resulting metallic Ni may deposit at high-temperature spots 200 along the light-emitting die 105. For example, Ni regions 205 may form along the anode contact area and/or the edge of the p-mesa and lead to short-circuit failures. In addition, the CO formed in the Ni-formation reaction may cause further reactions with the original package metallization 115, resulting in a vicious, self-sustaining reaction cycle. The nickel carbonyl therefore operates as a Ni transport mechanism, moving metallic Ni from where it is desired (i.e., the package metallization 115) to where it is not (i.e., other portions of the light-emitting die 105).

Figure 3:
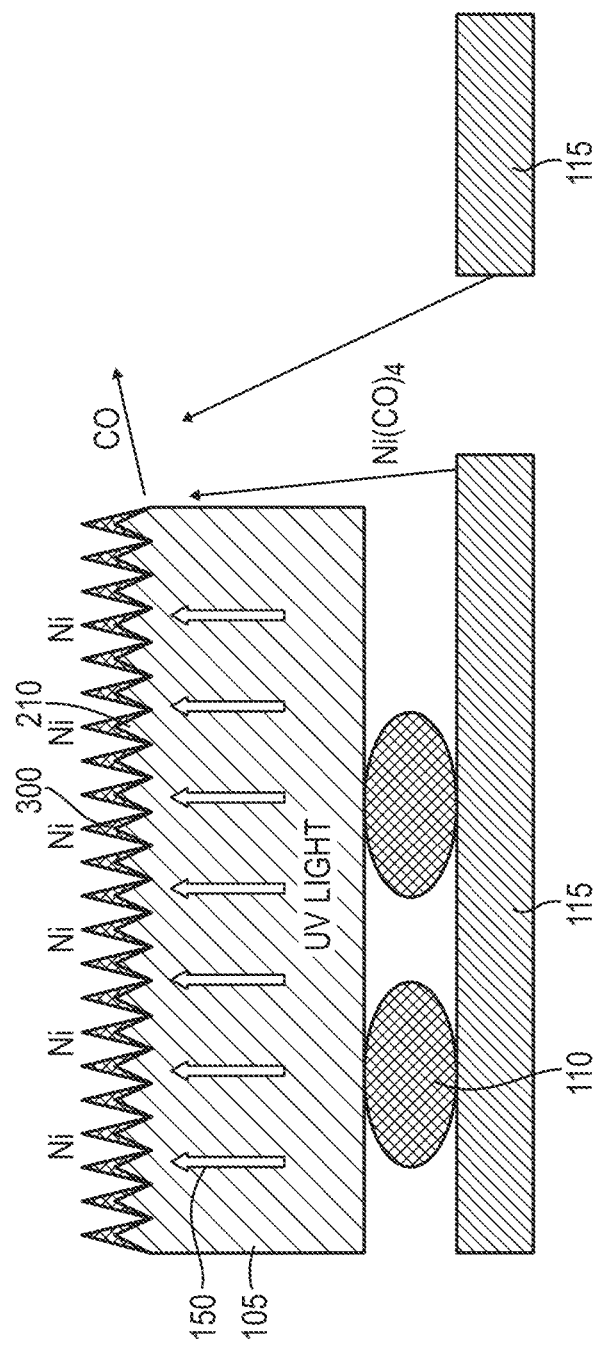
FIG. 3 is a magnified cross-sectional schematic of a portion of the device of FIG. 1 in accordance with various embodiments of the invention.

In addition, as shown in FIG. 3, the nickel carbonyl may also decompose via a photochemical reaction with the UV light 150 emitted by the light-emitting die 105:

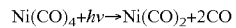

$$Ni(CO)_4 + h\nu \rightarrow Ni(CO)_2 + 2CO$$

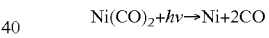

$$Ni(CO)_2 + h\nu \rightarrow Ni + 2CO$$

Figure 4:
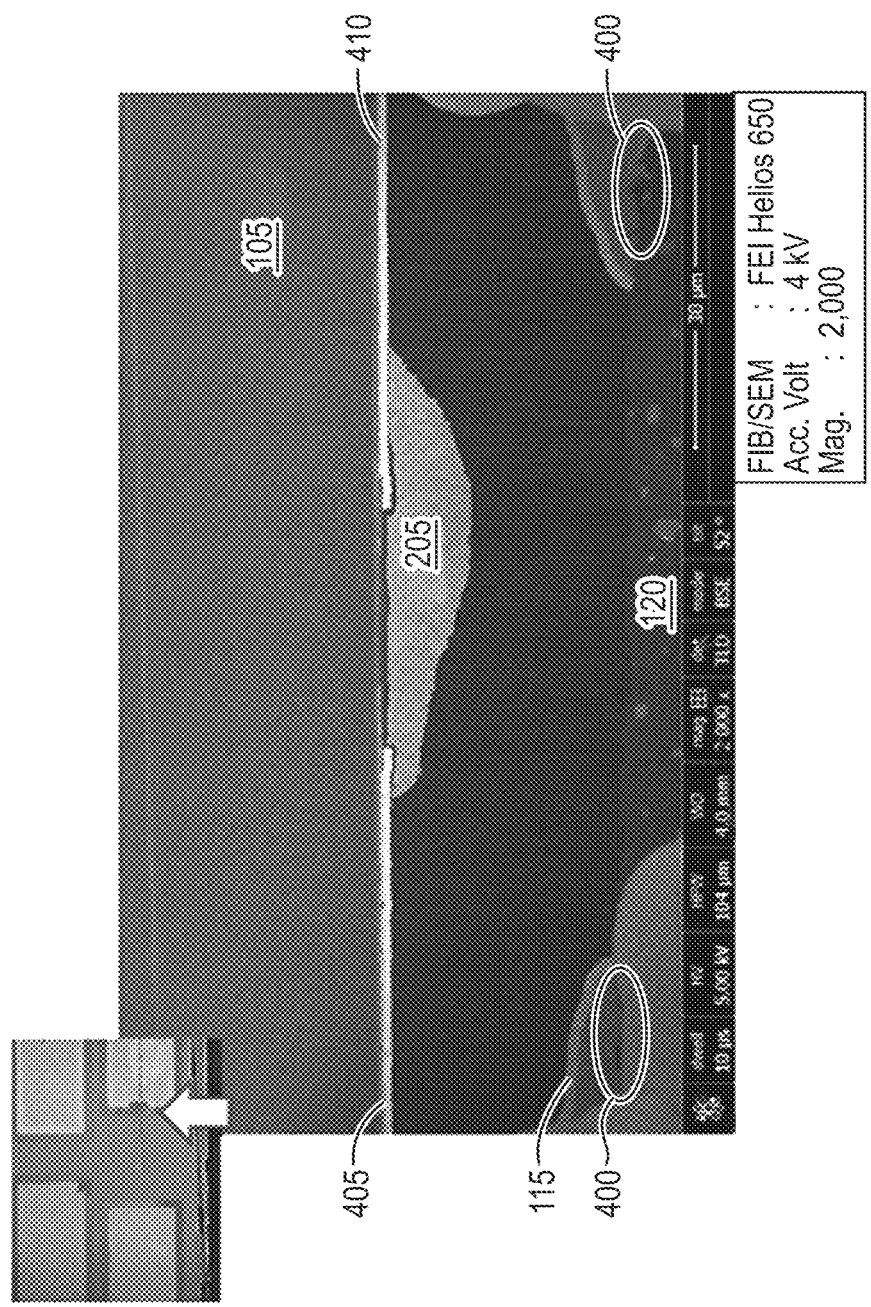
FIG. 4 is a cross-sectional micrograph of a portion of a packaged UV LED in which a Ni-containing region has created a short circuit between two device electrodes.

Moreover, as also shown in FIG. 3, the resulting Ni 300 may be deposited over an exposed surface 210 (e.g., back surface, in a flip-chip configuration) of the UV light-emitting die 105 and block at least a portion of the UV light produced by the light-emitting die 105, resulting in degradation of the optical power of the device. In addition, the nickel carbonyl itself may even deposit on the exposed surface 210 of the light-emitting die 105, even in the absence of further photochemical decomposition, further contributing to the optical degradation of the device. FIG. 4 is a cross-sectional scanning electron microscopy (SEM) micrograph depicting the results of the above-described sequence within an LED package. In the example structure depicted in FIG. 4, the metallization 115 includes a layer of Au having a thickness of approximately 1 µm and a layer of Ni having a thickness of approximately 4 µm. As shown, voids 400 have formed within a Ni layer of the package metallization 115, and a volume of Ni 205 has formed between electrodes 405, 410 on the light-emitting die 105, resulting in a short circuit.

As mentioned above, the Ni transported away from the package metallization 115 may also tend to deposit at higher-temperature regions 200 on the light-emitting die 105. Unfortunately, existing leakage paths within the device 105 due to, e.g., crystalline defects such as dislocations, may already tend to operate at higher temperatures (e.g., due to higher levels of current therein). Thus, further Ni deposition at these locations may tend to exacerbate existing leakage and increase leakage currents of the packaged devices (e.g., by making the leakage paths more conductive).

Embodiments of the invention include various techniques and structures for reducing or substantially eliminating metal (e.g., Ni) transport resulting from UV-induced degradation of epoxy and/or other bonding agents within the package of the light-emitting device. For example, in various embodiments of the invention, the interior space of the package is substantially filled with nitrogen and/or an inert gas (e.g., argon) such that, when the lid is sealed to the base of the package, the interior of the package is substantially free of oxygen. For example, the lid may be attached to the package while in an ambient environment including, consisting essentially of, or consisting of nitrogen and/or one or more inert gases such that less, or substantially no, oxygen is present within the device when the lid is sealed to the package. In other embodiments, the interior space may be evacuated to remove at least a portion of the oxygen therefrom when the lid is sealed to the base of the package. For example, the lid may be attached to the package while in a partial vacuum, or the interior space may be exposed to a vacuum during and/or after attachment. The lack of (or lesser concentration of) oxygen within the interior space of the package prevents or substantially reduces the formation of deleterious reaction products (e.g., nickel carbonyl) during the operation of the UV light-emitting device, improving reliability and performance of the device.

In various embodiments, the formation of deleterious reaction products within the interior space of the package during operation of the UV light-emitting device may be reduced or substantially eliminated via use of metallization that lacks (i.e., is substantially free of, except for trace-level impurity amounts) Ni therein. In such embodiments, the entire interior space of the package containing the light-emitting device may be substantially free of Ni, at least in locations that may be exposed to UV light during operation of the light-emitting device. Alternative metals that may be utilized for metallization in accordance with embodiments of the present invention may include, for example, copper (e.g., copper plated with gold, or copper deposited by electroless plating), gold, and/or tin, and/or mixtures and/or multilayer structures containing one or more of these metals and one or more other metals.

In various embodiments of the invention, UV-induced degradation of epoxy may also result in formation and retention of moisture within the package, thereby reducing or compromising performance and/or reliability of the UV light-emitting device. Such reactions and moisture formation may occur even when the metallization and/or the interior space of the package is substantially free of nickel, and thus various embodiments of the invention detailed herein may have utility (e.g., may improve or maintain performance and/or reliability of the device) even when utilized with metallization schemes and/or package interiors that are substantially free of nickel.

Figure 5A:
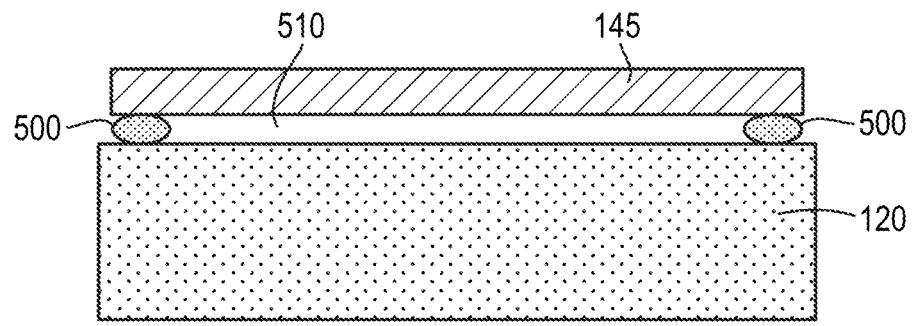
FIG. 5A is a cross-sectional schematic of a packaged light-emitting device in accordance with various embodiments of the invention.
Figure 5B:
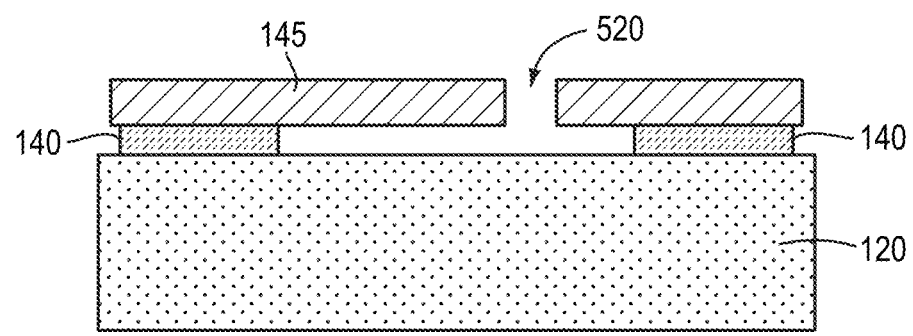
FIG. 5B is a cross-sectional schematic of a packaged light-emitting device in accordance with various embodiments of the invention.

As shown in FIGS. 5A and 5B, the package may also be vented in order to provide an inlet for additional oxygen and an outlet for $CO_2$ and CO that may be produced via reaction between the epoxy and the UV light emitted by the light-emitting die. For example, as shown in FIG. 5A, the lid 145 of the package may be bonded to the package base 120 at one or more points 500 (e.g., via epoxy 140 or another bonding agent) with empty spaces therebetween, forming one or more vents 510 that remain open during device operation. In other embodiments, as shown in FIG. 5B, one or more holes 520 may be formed (by, e.g., mechanical or laser drilling) in one or more parts of the package in order to form one or more vents that extend from the interior of the package to the outside environment. For example, one or more holes 520 may be drilled in the transparent lid 145, in the base 120 of the package, or at the interface between the base 120 of the package and the lid 145. While vents 510 and holes 520 may remain empty, in various embodiments of the invention, such openings may be partially or substantially filled with another material, as long as gases such as $CO_2$ and CO may exit the package through such material. As such, a "hollow vent," as utilized herein, is not necessarily devoid of any material therewithin, but may be partially or substantially completely filled with a material that permits gas exchange therethrough.

Figure 5C:
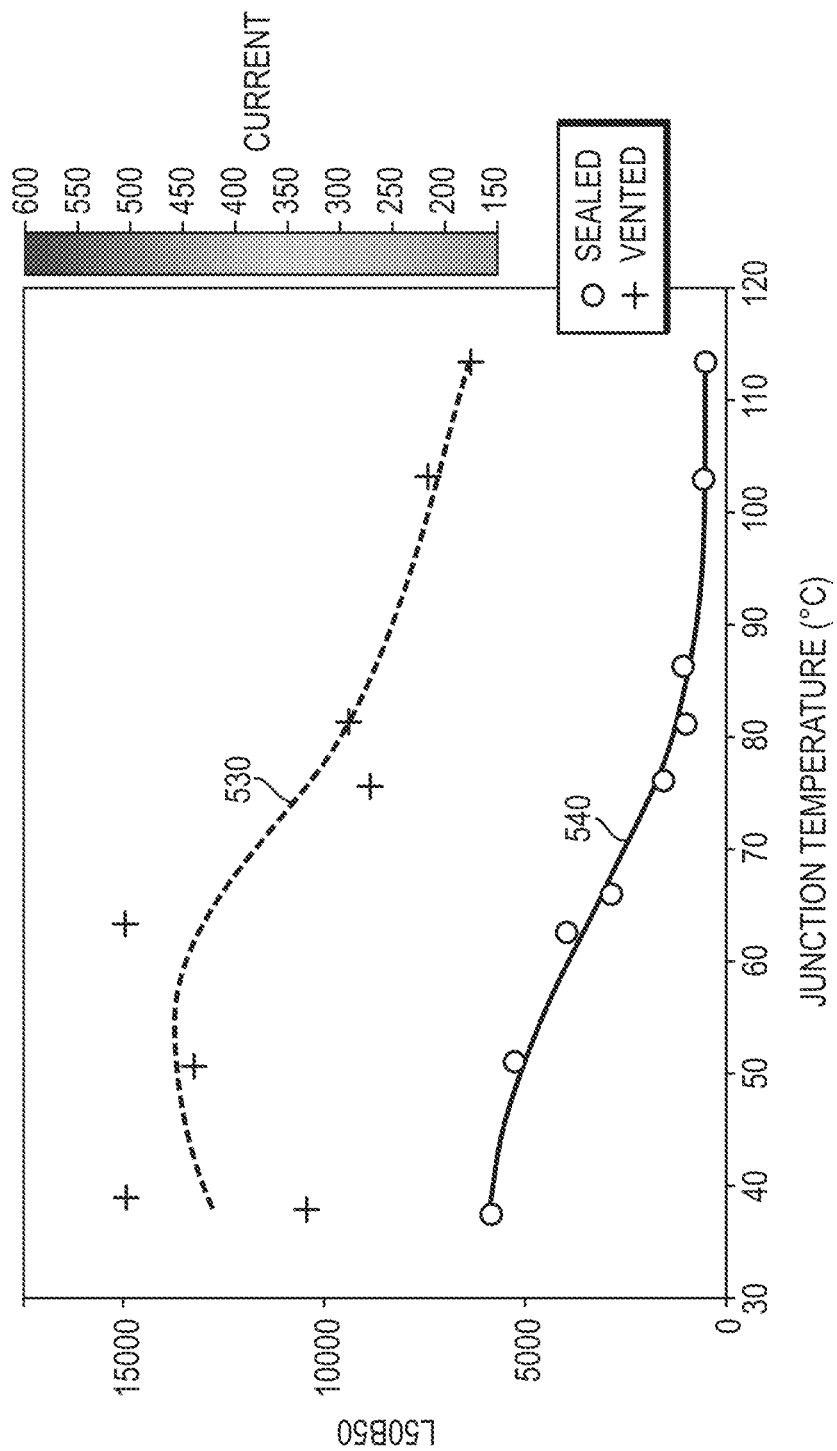
FIG. 5C is a graph comparing device reliability of packaged UV LEDs in unvented packages with device reliability of packaged UV LEDs in packages vented in accordance with various embodiments of the invention.
Figure 5D:
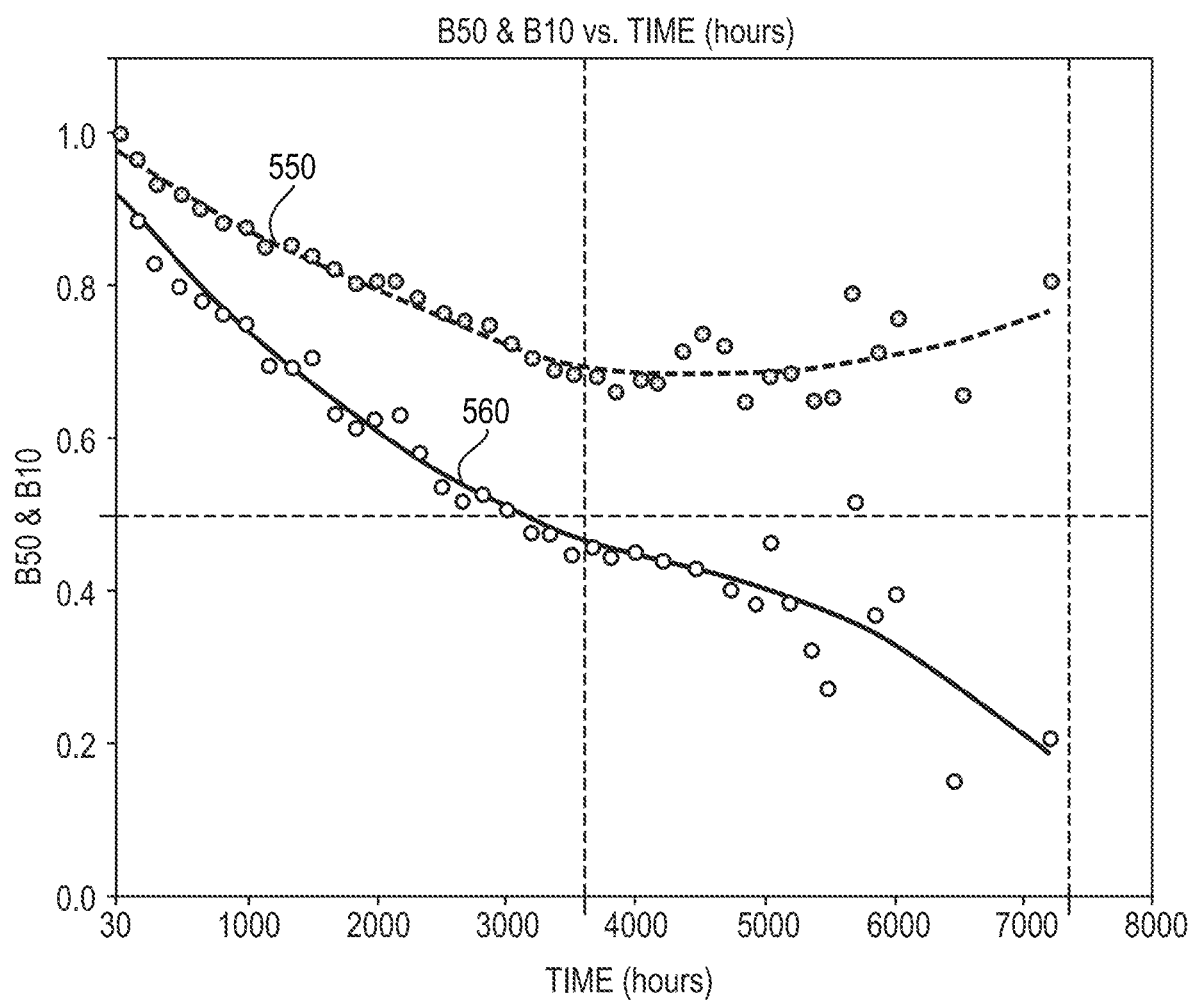
FIG. 5D is a graph of reliability data of UV LEDs packaged in accordance with embodiments of the invention.

FIG. 5C is a graph of reliability data comparing statistical lifetimes of vented packages in accordance with embodiments of the present invention with control, unvented packages as a function of junction temperature (which is related to driving current—as shown, the driving current of the samples increases for the points corresponding to higher junction temperatures). As shown, the L50B50 value (i.e., the point (in this case measured in hours of operation) at which 50% of evaluated samples emit at least 50% of their initial light output) of the vented devices 530 is significantly higher than that for the unvented control devices 540, particularly at high driving currents and concomitantly high junction temperatures. For example, vented packages in accordance with embodiments of the present invention exhibit L50B50 values between 10,000 and 15,000 hours for junction temperatures between 30° C. and 50° C., while the control devices exhibit L50B50 values between 5,000 and 6,000 hours. At junction temperatures of 100° C. to 115° C., vented packages in accordance with embodiments of the invention exhibit L50B50 values between 6,000 and 7,500 hours, while control devices exhibit L50B50 values of well under 1,000 hours. FIG. 5D is a graph of L50B50 (line 550) and L50B10 (line 560) for 38 different lots of light-emitting devices (in this case LEDs) tested at drive currents of 350 mA and junction temperatures of 35° C. or 55° C. (similar results were obtained for each junction temperature). As shown, the L50B50 is greater than 7,000 hours for every lot of tested devices.

Figure 6:
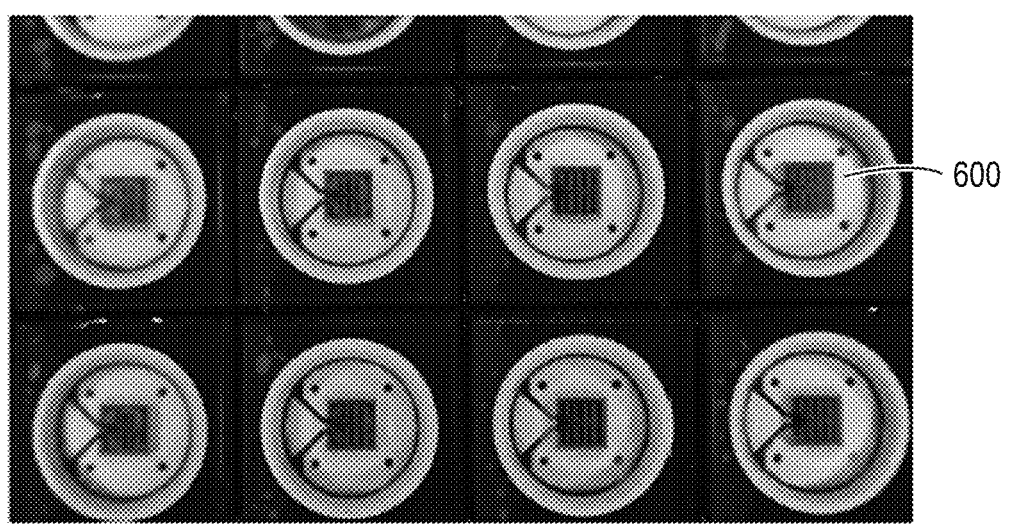
FIG. 6 is a plan-view photograph of packages for UV light-emitting devices prior to separation thereof in accordance with embodiments of the invention.

In various embodiments, holes may be formed in the package either before or after the package is separated from other packages in a dicing step. As shown in the plan-view photograph of FIG. 6, in various embodiments the package 600 is initially a portion of a larger construct that includes multiple different packages defined in a single ceramic piece. Each of the packages 600 is separated from the others in a dicing step, in which a cutting instrument (e.g., a diamond saw) cuts between the various packages 600 to release them from each other. Because water or other cooling liquid is often utilized to cool the saw and remove debris during the cutting process, such liquid may infiltrate the package if it is vented before the dicing step. Thus, in various embodiments of the invention, one or more of the vents are formed after the dicing step and any introduction of water or other cooling fluid is complete.

Figure 7:
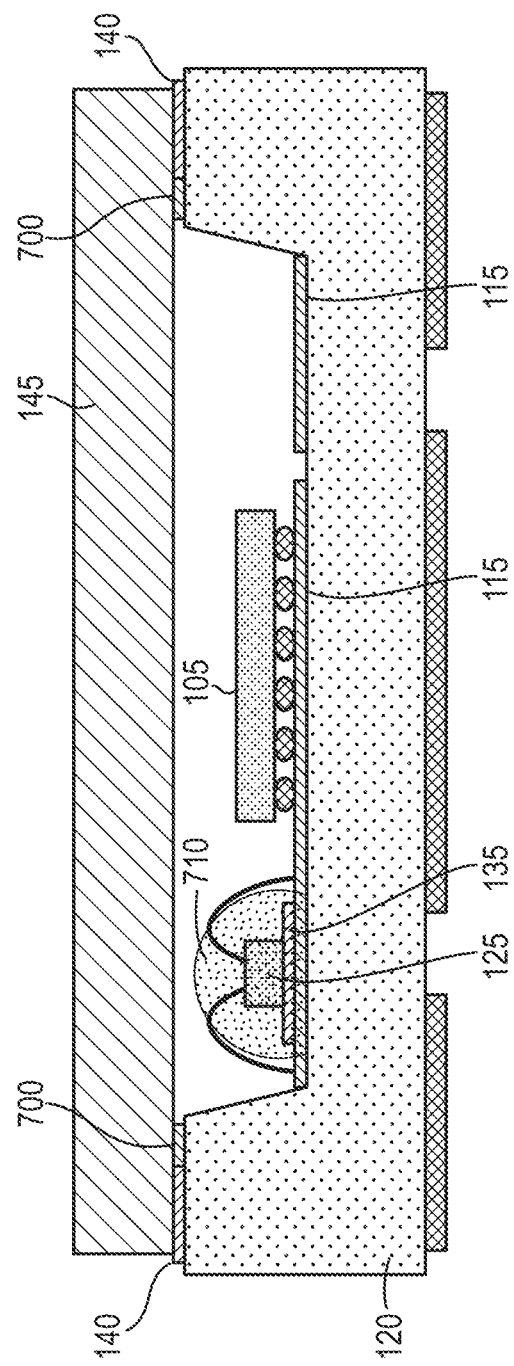
FIG. 7 is a cross-sectional schematic of a packaged UV light-emitting device in accordance with various embodiments of the invention.

In various embodiments of the invention, UV light emitted by the light-emitting die is blocked from propagating to substantially any epoxy within the package. For example, as shown in FIG. 7, epoxy 140 utilized to attach the lid 145 to the base of the package 120 may be supplemented with a barrier layer 700 (e.g., a metal layer, which may or may not include, consist essentially of, or consist of the same metallization as the package metallization) that prevents propagation of UV light from the light-emitting die 105 to the epoxy 140 during device operation. The barrier layer 700 may include, consist essentially of, or consist of, for example, a UV reflector such as aluminum and/or polytetrafluoroethylene (PTFE) such as Optical PTFE available from Berghof Fluoroplastic Technology GmbH of Eningen, Germany. At least one dimension (e.g., thickness and/or width) of the barrier layer 700 (and/or of other features disclosed herein that may include, consist essentially of, or consist of PTFE) may be greater than 1 mm, greater than 2 mm, or even greater than 5 mm, as PTFE-based shields or other features may not be sufficiently opaque to UV light at lesser thicknesses. The dimension(s) of the barrier layer 700 may be less than 20 mm or less than 10 mm.

In various embodiments, the epoxy 135 attaching the voltage regulator 125 to the base of the package 120 may be covered with a barrier layer 710 that prevents UV light propagation to the epoxy 135. For example, an encapsulant that is opaque to UV light may be disposed over the epoxy 135 (and, in various embodiments, the voltage regulator 125 and substantially all or at least a portion of each of the wire bonds 130 (if present)). Since the propagation length of UV light within the opaque encapsulant 710 is minimal or substantially zero, the UV light is unable to propagate to the epoxy 135 and initiate the deleterious set of reactions detailed above. The opaque encapsulant 710 (or other UV-opaque barrier 710) may substantially cover the epoxy 135 but, in various embodiments, need not cover the entirety of the voltage regulator 125 or any wire bonds 130 extending therefrom. In other embodiments, the voltage regulator 125 (and/or any other electronic device disposed in the package) may be attached to the package 120 via metal bump bonds or other interconnects rather than via epoxy 135, thereby removing such epoxy 135 from the package altogether. Opaque encapsulants in accordance with embodiments of the invention include, consist essentially of, or consist of, for example, polytetrafluoroethylene, polyetheretherketone, a fluoropolymer such as a perfluoroalkoxy alkane, or a resin. The opaque encapsulant may have therewithin one or more pigments to give the encapsulant a black color and provides the encapsulant with UV opacity.

Figure 8A:
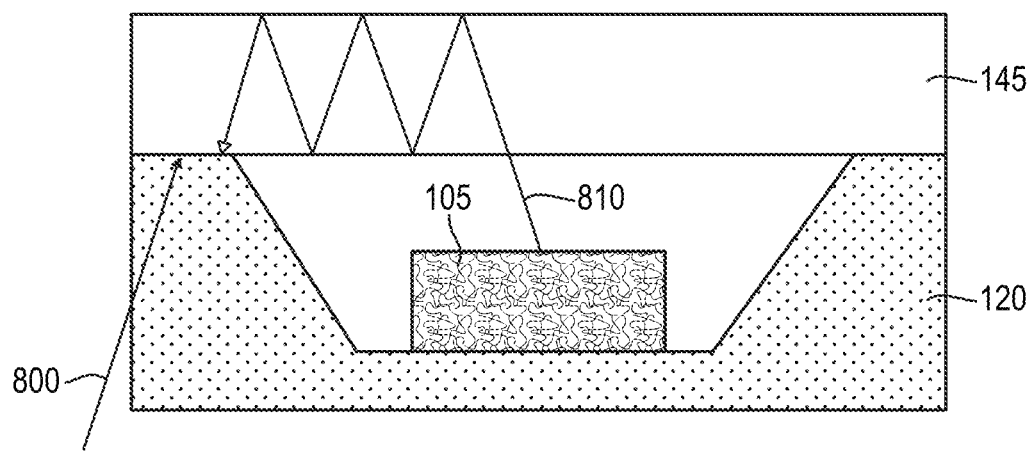
FIG. 8A is a cross-sectional schematic of a packaged UV light-emitting device in accordance with various embodiments of the invention.
Figure 8B:
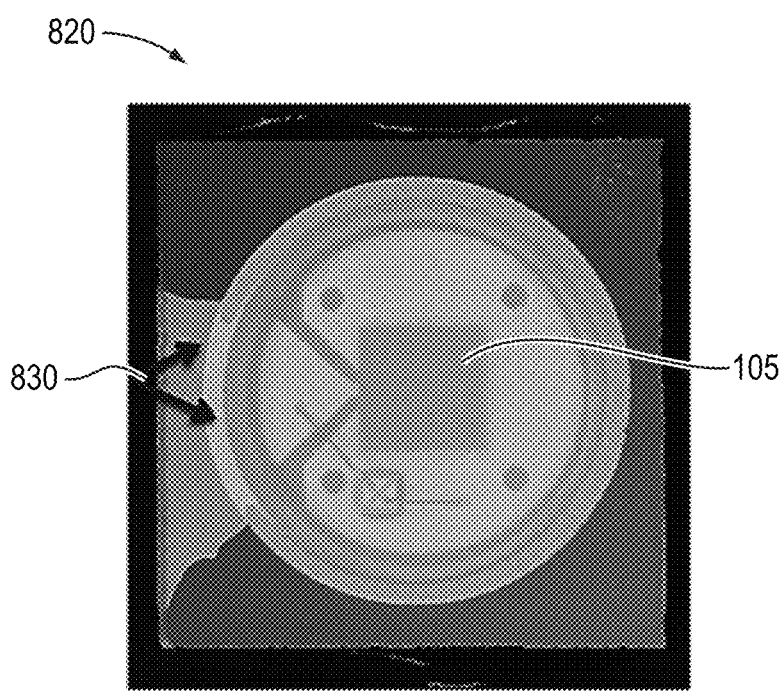
FIG. 8B is a plan-view photograph of a packaged UV LED in which voids have formed.

The present inventors have found that the lifetime and reliability of a packaged UV light-emitter may also be limited by the epoxy material utilized to attach the transparent lid to the package. In various embodiments of the present invention, the epoxy material utilized to seal the transparent lid to the package is shielded from UV light emitted by the light-emitting die that reflects within the lid one or more times (i.e., in the manner of a waveguide). FIG. 8A illustrates this potential issue, in which a degradation reaction occurs at a location 800 where epoxy is disposed at the interface between the package base 120 and the transparent lid 145. As shown, even if UV light 810 from the light-emitting die 105 does not propagate directly to the epoxy layer (little or none of which is directly exposed along a direct line-of-sight to the light-emitting die 105), the UV light 810 may propagate within the transparent lid 145 itself (e.g., via total internal reflection). The light 810 may propagate to the epoxy layer, a large portion (or even substantially the entirety) of the top surface of which is directly exposed to such UV light 810 and eventually degraded. FIG. 8B is a micrograph of a packaged UV LED device 820 after degradation of the epoxy as illustrated in FIG. 8A. As shown in FIG. 8B, voids 830 between the transparent lid and the package base may form as the epoxy degrades, and such voids 830 may limit the reliability of the device. For example, the transparent lid may eventually detach from the package base, exposing the light-emitting die to the surrounding environment, or the voids 830 may provide a path for oxygen from the outside environment to penetrate into the package and exacerbate deleterious reactions detailed above.

Figure 8C:
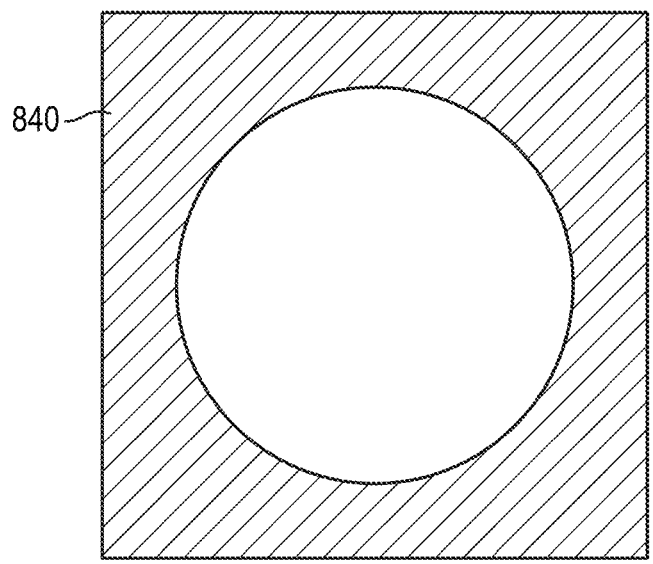
FIG. 8C is a plan-view schematic of a transparent lid for a UV light-emitting device package incorporating a shield material in accordance with various embodiments of the invention.
Figure 8D:
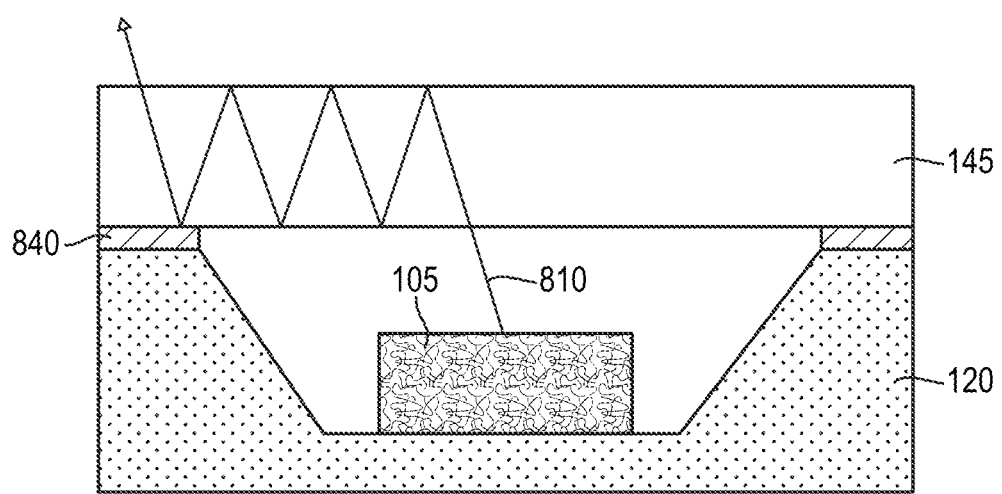
FIG. 8D is a cross-sectional schematic of a packaged UV light-emitting device incorporating the lid of FIG. 8C in accordance with various embodiments of the invention.

In accordance with various embodiments of the invention, the epoxy material utilized to attach the transparent lid to the package base is shielded from waveguided UV light within the transparent lid via utilization of an opaque shield disposed between the lid and the package base or disposed on the lid itself (i.e., at least on the surface of the lid facing the epoxy and the package base). FIG. 8C schematically depicts a plan view of such a shield 840, which may be deposited as a layer upon the transparent lid itself; as such, FIG. 8C also corresponds to a plan view of such a coated lid. As shown, the surface area of the lid substantially corresponding to the contact area between the lid and the underlying epoxy and/or the package base may be coated with an opaque material that reflects or strongly absorbs UV light. For example, the material of the shield 840 may include, consist essentially of, or consist of a strong UV reflector such as aluminum or PTFE and/or a strong UV absorber such as an opaque encapsulant as detailed in the '655 application. As shown in FIG. 8D, the shield 840 may advantageously reflect UV light trapped within the lid 145 away from the epoxy and out of the package. Thus, embodiments of the invention that utilize reflective shield materials may also exhibit increased photon extraction, thereby improving the overall performance (e.g., efficiency) of the device. In addition, the shield 840 may also protect the epoxy from UV light that originates from outside of the package (e.g., from the ambient environment and/or from other nearby UV light-emitting devices) and that enters the package and/or the lid 145. In various embodiments, an anti-reflective coating may be disposed on the top surface of the lid 145 in at least the region over which the shield 840 is disposed, in order to decrease or substantially eliminate deleterious reflections proximate the region of the shield 840. In various embodiments of the invention, a metallic shield 840 need not include, consist essentially of, or consist of a metal material that is highly reflective to UV light (e.g., aluminum), as even other metals (e.g., titanium, gold, or a multilayer structure of a titanium layer and a gold layer) may reduce degradation of shielded epoxy material even if the UV light is not completely reflected away therefrom.

Figure 8E:
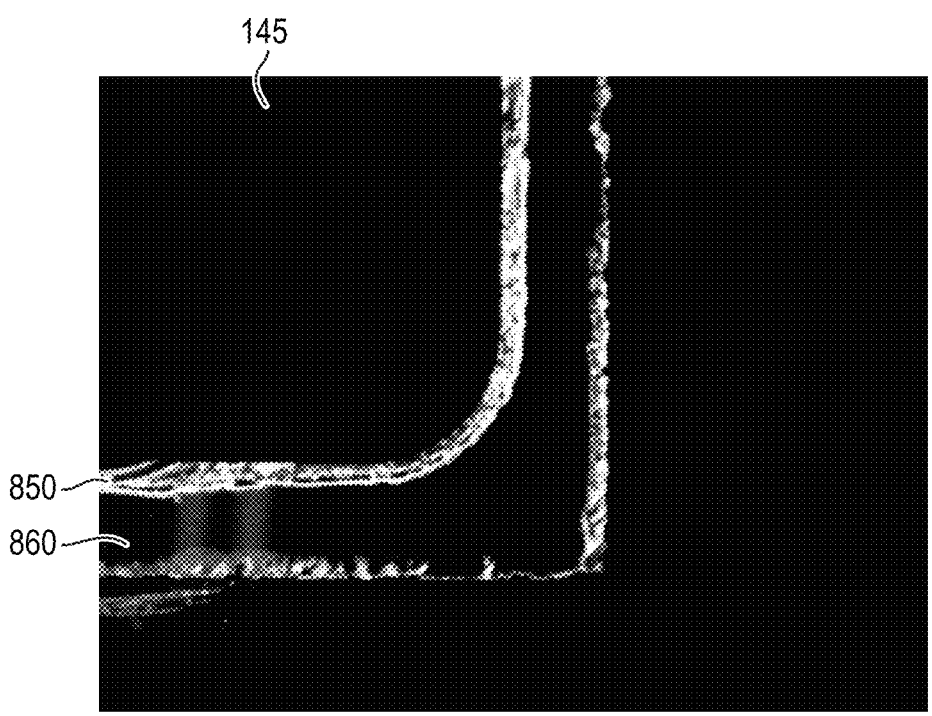
FIG. 8E is a plan-view photograph of a portion of a transparent lid incorporating a shield material and on which is disposed an epoxy region uncovered by the shield material and an epoxy region covered by the shield material during reliability testing in accordance with various embodiments of the invention.

FIG. 8E is a plan-view photograph of the bottom surface of a lid after 98 hours of an experiment performed to demonstrate the effectiveness of the shield 840. In the experiment, a metallic shield 840 was disposed on the bottom surface of the lid such that approximately 0.1 mm of the epoxy material (i.e., the inner portion of the epoxy) attaching the lid to the package base was not covered by the shield 840. The remaining portion of the epoxy was covered by the shield 840. The light-emitting die (in this case, a UV LED die) was operated at 45° C., a drive current of 350 mA, and a drive current of 20-25 mA. As shown, the inner exposed portion 850 of the epoxy material deteriorated due to exposure to UV light transmitted within the transparent lid, while the outer shielded portion remained undamaged and elastic, thereby preventing delamination of the lid or formation of voids between the lid and the package base. Similar results were observed after testing times of 335 hours and 667 hours.

Figure 9:
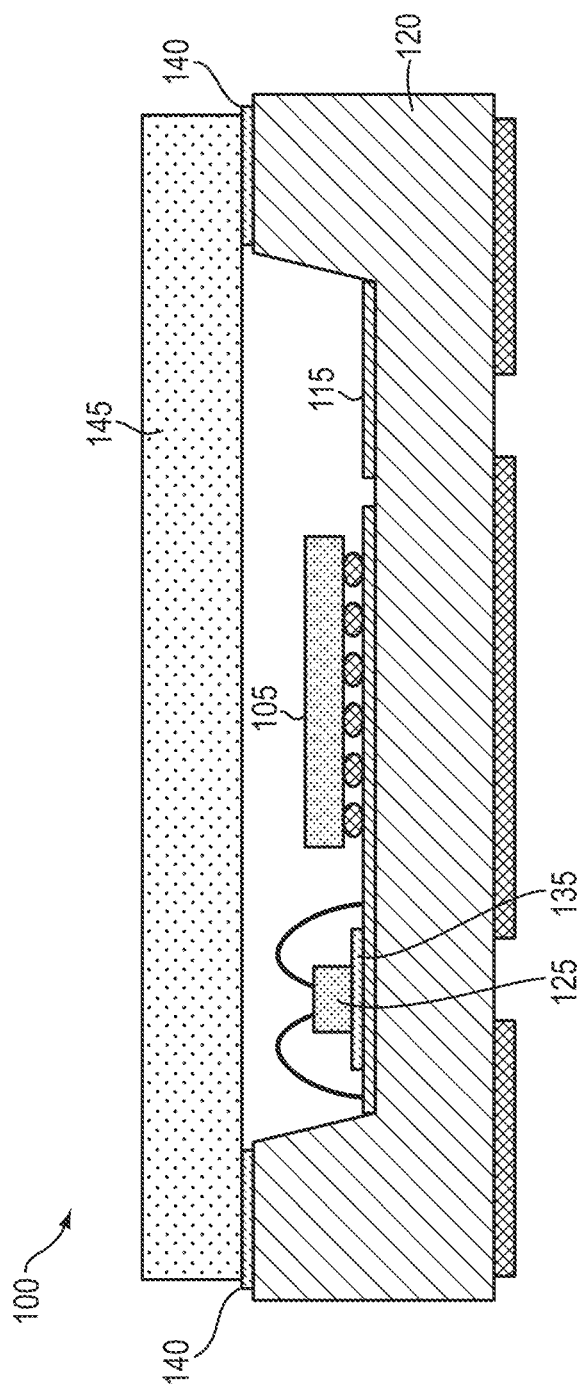
FIG. 9 is a cross-sectional schematic of a packaged UV light-emitting device in accordance with various embodiments of the invention.
Figure 10A:
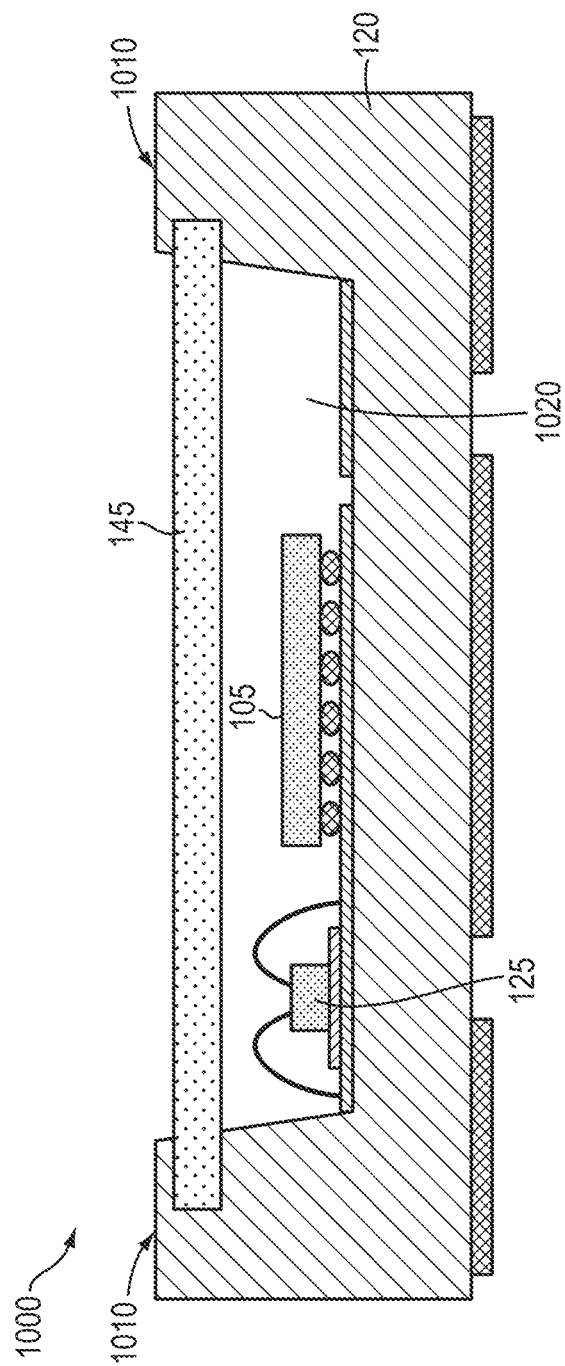
FIG. 10A is a cross-sectional schematic of a packaged UV light-emitting device incorporating slots to accommodate a transparent lid in accordance with various embodiments of the invention.
Figure 10B:
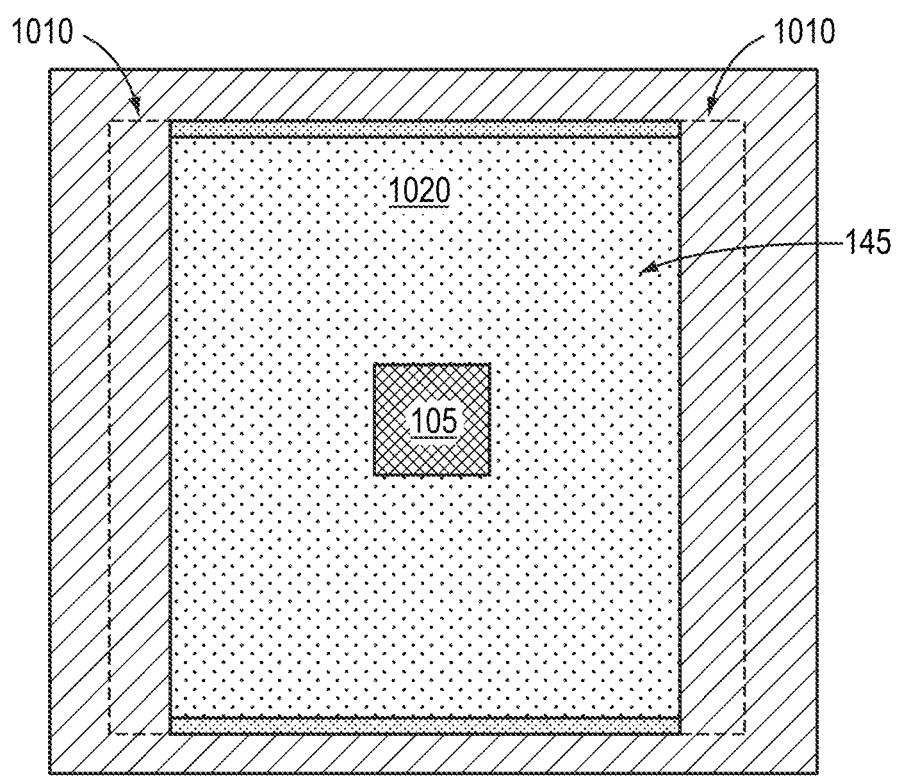
FIG. 10B is a plan-view schematic of the packaged device of FIG. 10A in accordance with various embodiments of the invention.

Embodiments of the present invention may also utilize various different techniques for attaching the transparent lid 145 to the package base 120 in order to address issues detailed herein related to epoxy degradation. FIG. 9 is a slightly simplified version of FIG. 1, illustrating various different epoxy layers 135, 140 within the package that may degrade upon exposure to UV light emitted by the light-emitting die 105. Since such degradation may result in detachment of the transparent lid 145 or formation of hollow voids between the lid 145 and the package base 120, embodiments of the present invention utilize different configurations for lid attachment. For example, FIG. 10A schematically depicts a side view of a package 1000 that incorporates slots 1010 through which the lid 145 is disposed for attachment to the package base 120. As shown, one or more sidewalls of the package base 120 may define therewithin a hollow slot 1010 sized and shaped to be substantially fully occupied by a portion of the lid 145 when the lid 145 is slid through the slots 1010 and over the light-emitting die 105, thereby partially or substantially fully sealing the cavity 1020 in which the light-emitting die 105 is disposed. In various embodiments, the voltage regulator 125 (if present) may be connected to the package base 120 without epoxy (e.g., via metallic ball bonds), or any epoxy utilized to attach voltage regulator 125 may be coated with material 710 as shown in FIG. 7. FIG. 10B is a schematic plan view of the package 1000 of FIG. 10A. As shown, in order to facilitate sliding of the lid 145 through the slots 1010 in the package sidewalls, slots 1010 may be formed on two opposing sides of the package base, and between those sides the package base may have a height that extends only to the bottom of the slots 1010. In this manner, the lid 145 may be slid into place. In various embodiments, the fit of the lid 145 in the slots 1010 is sufficiently snug that no additional attachment material is necessary. In other embodiments, an adhesive such as epoxy may be disposed along one or more sides of the lid 145 that contact the package base 120, and the epoxy may help keep the lid 145 in place. In various embodiments, such epoxy may be shielded (e.g., as detailed herein) from UV light emitted by the light-emitting die 105. In other embodiments, the mechanical contact between the lid 145 and the slots 1010 is sufficient to keep the lid 145 in place even upon degradation of any epoxy disposed along the lid 145.

Figure 10C:
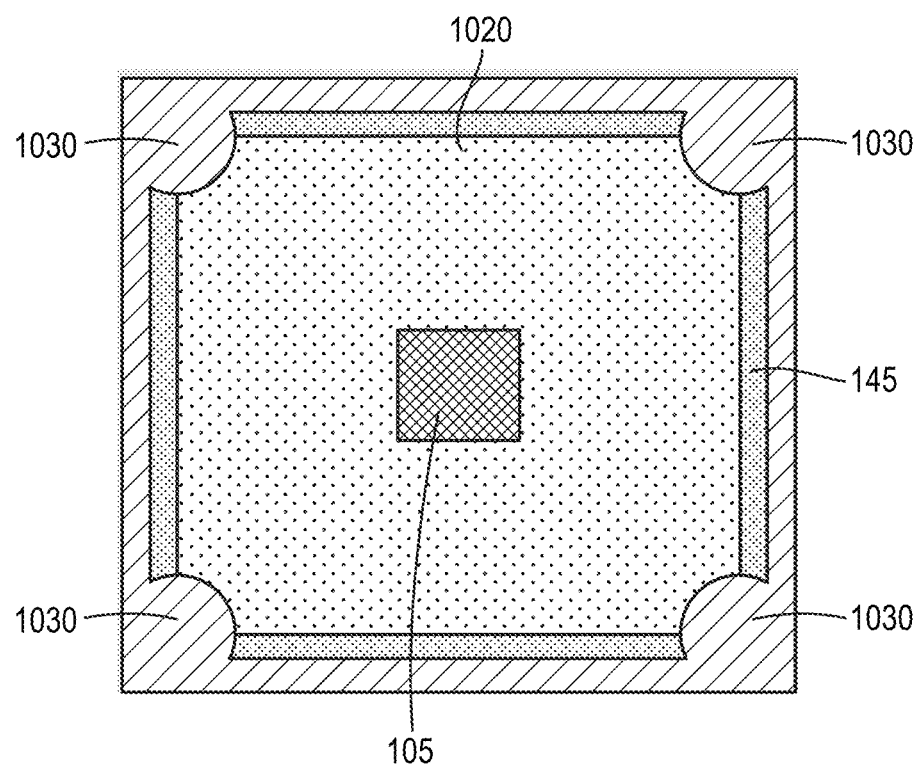
FIG. 10C is a plan view schematic of a packaged UV light-emitting device incorporating corner clips to retain a transparent lid in accordance with various embodiments of the invention.

FIG. 10C is a plan view of another embodiment of the present invention in which one or more corner clips 1030 are utilized to maintain contact between the transparent lid 145 and the package base 120, even upon degradation of any epoxy disposed therebetween. As shown, the package base 120 itself may define protrusions at or proximate one or more of the corners of the cavity 1020 (and thus the lid 145 to be disposed thereover) that are configured to overlap the lid 145 when the lid 145 is disposed in place over the cavity 1020. In various embodiments, the mechanical contact provided by the corner clips 1030 maintains contact between the lid 145 and the package base 120 even upon epoxy degradation. The corner clips 1030 may include, consist essentially of, or consist of, e.g., clamps or other mechanical fasteners that are not formed from portions of the package base 120. In various embodiments, the corner clips 1030 may include, consist essentially of, or consist of one or more metals. The corner clips 1030 may be applied over and/or around the lid 145 and the package base 120 after the lid 145 is placed into position over the package base 120 (e.g., in the manner depicted in FIG. 1). The corner clips 1030 may be spring-loaded to exert pressure on the lid 145 to urge the lid 145 and the package base 120 together, and/or the corner clips 1030 may be adhered in place via an adhesive material or other bonding agent. Although FIG. 10C depicts the corner clips 1030 as being disposed at corners of the lid 145, in various embodiments of the invention, one or more (or even all) of the corner clips 1030 may be disposed along straight or curved edges of the lid 145 (i.e., between corners or vertices) or proximate or at corners or vertices of the lid 145; the lid 145 may itself be polygonal or circular, and the corner clips 1030 may be disposed along the periphery of the lid 145 at any one or more points.

Figure 10D:
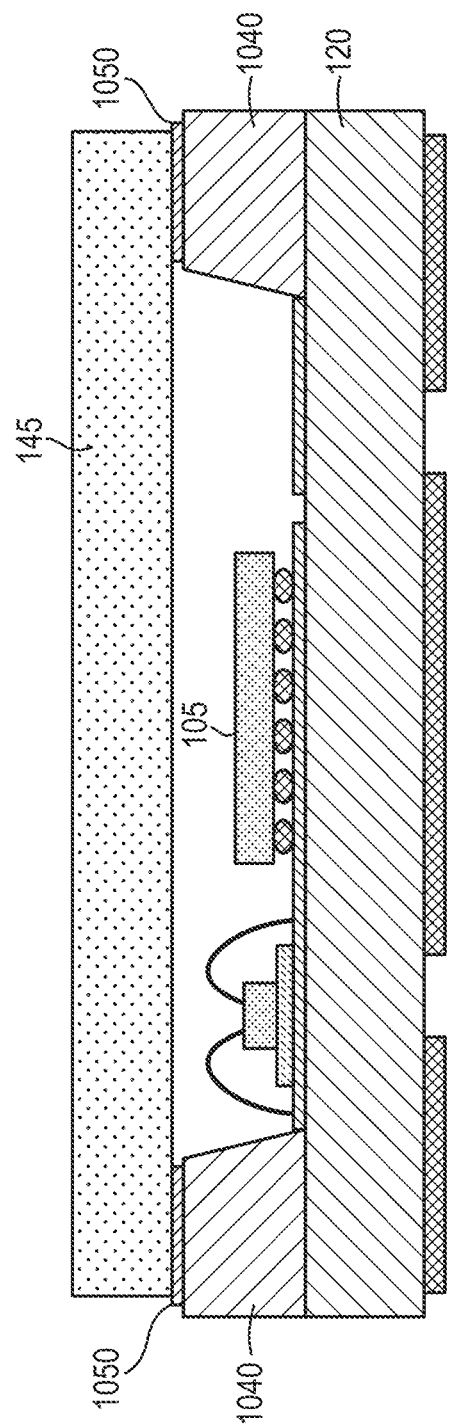
FIG. 10D is a cross-sectional schematic of a packaged UV light-emitting device in which the transparent lid is attached to the package base via a glass-metal seal in accordance with various embodiments of the invention.

In various embodiments of the present invention, the epoxy typically utilized to seal the transparent lid 145 to the package base 120 is replaced by another material less (or substantially not) vulnerable to degradation upon exposure to UV light emitted by the light-emitting die 105. For example, as shown in FIG. 10D, one or more portions of the package base 120 to be sealed to the transparent lid 145 may be at least partially composed of metal, and the lid 145 may be attached to such portions via a glass-to-metal seal 1050. For example, all or portions of one or more sidewalls 1040 of the package that extend above the base of the package and around the light-emitting die 105 may be composed of and/or coated with metal to facilitate attachment via the glass-to-metal seal 1050. The metal may include, consist essentially of, or consist of, for example, aluminum and/or another metal that is at least partially reflective to UV light emitted by the light-emitting die 105. In various embodiments, other portions of the package (e.g., the base on which the light-emitting die 105 is disposed) are at least partially composed of a non-metallic and/or electrically insulating (e.g., ceramic) material (e.g., AlN). In order to facilitate sealing via the glass-to-metal seal 1050, the metallic portions of the package may be oxidized, as the oxide thereby formed may adhere more strongly to the transparent lid 145. For example, all or portions (e.g., the metallic portions) of the package may be exposed to an oxygen-containing ambient at an elevated temperature to enable growth of an oxide on the metal portions of the package prior to formation of the glass-to-metal seal 1050.

The glass-to-metal seal 1050 between the package and the transparent lid 145 may be formed via use of a sealant such as glass frit, a glass solder, a molybdenum foil, and/or silver chloride. For example, a glass frit or glass solder that includes a glass powder (along with, in various embodiments, an organic binder, one or more inorganic fillers, and/or one or more solvents) may be deposited between the package sidewalls and the lid and heated to burn out any volatile components, resulting in a solid glass-to-metal seal 1050. Pressure may be applied to the lid 145 and/or to the package base 120 during formation of the glass-to-metal seal 1050 to facilitate sealing. After sealing, the interface between the lid 145 and the package base 120 is occupied by the glass-to-metal seal 1050, which is not subject to the degradation processes detailed herein for epoxy bonding agents. Other glass solders that may be utilized in accordance with embodiments of the invention include binary or ternary mixtures of thallium, arsenic and sulfur, as well as materials including, consisting essentially of, or consisting of leaded glasses, borate glass, borosilicate glass, phosphate glass, and/or $PbO$—$ZnO$—$B_2O_3$.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:
1. An illumination device comprising:
   a package comprising (i) a base defining a recessed interior volume and (ii) a transparent lid disposed over the base and at least partially covering the interior volume;

a light-emitting device configured to emit ultraviolet (UV) light and disposed within the interior volume, the light-emitting device comprising a light-emitting semiconductor die disposed within the interior volume;
a first epoxy sealing the lid to the base;
a metallization pattern disposed on the base and electrically coupled to the light-emitting device; and
a hollow vent fluidly coupling the interior volume, and the light-emitting semiconductor die, with atmospheric air disposed outside of the illumination device,
wherein the vent comprises one or more holes defined through the lid.

2. The illumination device of claim 1, wherein the first epoxy seals the lid to the base at two or more discrete points, and the vent further comprises an opening disposed between the two or more discrete points.

3. The illumination device of claim 1, wherein the vent further comprises one or more holes through the base.

4. The illumination device of claim 1, wherein the metallization pattern comprises Ni.

5. The illumination device of claim 1, wherein the light-emitting device comprises a light-emitting diode or a laser.

6. The illumination device of claim 1, wherein (i) the vent is a single hole defined through the lid, (ii) the vent permits two-way gas exchange between the light-emitting semiconductor die and the atmospheric air disposed outside of the illumination device, and (iii) the vent is the only hole fluidly coupling the interior volume and the light-emitting semiconductor die with atmospheric air disposed outside of the illumination device.

7. The illumination device of claim 1, wherein no wire bonds are connected to the light-emitting device.

8. The illumination device of claim 1, further comprising one or more voltage-regulation devices (i) disposed within the interior volume and (ii) electrically coupled to the metallization pattern.

9. The illumination device of claim 8, wherein at least one of the voltage-regulation devices comprises a zener diode.

10. The illumination device of claim 8, further comprising a second epoxy attaching at least one said voltage-regulation device to the base.

11. The illumination device of claim 10, further comprising a barrier material disposed over the second epoxy and substantially preventing propagation of UV light emitted by the light-emitting device to the second epoxy.

12. The illumination device of claim 11, wherein the barrier material comprises an encapsulant that is opaque to UV light.

13. The illumination device of claim 1, further comprising a barrier material disposed between the first epoxy and the interior volume, the barrier material substantially preventing propagation of UV light emitted by the light-emitting device to the first epoxy.

14. The illumination device of claim 13, wherein the barrier material comprises one or more metals.

15. The illumination device of claim 13, wherein the barrier material comprises polytetrafluoroethylene.

16. The illumination device of claim 1, wherein an entirety of a top surface of the lid is flat and parallel to a bottom surface of the base.

17. The illumination device of claim 16, wherein an entirety of a bottom surface of the lid is flat and parallel to the top surface of the lid.

18. An illumination device comprising:
a package comprising (i) a base defining a recessed interior volume and (ii) a transparent lid disposed over the base and covering the interior volume, wherein the base comprises a horizontal first surface disposed below the lid;
a light-emitting device configured to emit ultraviolet (UV) light and disposed within the interior volume;
a first epoxy sealing the lid to the base;
a metallization pattern disposed on the first surface of the base and electrically coupled to the light-emitting device;
one or more voltage-regulation devices (i) disposed within the interior volume and over the first surface of the base and (ii) electrically coupled to the metallization pattern;
a second epoxy attaching at least one said voltage-regulation device to the base, the second epoxy being disposed between and bonding the first surface of the base to a surface of the voltage-regulation device that faces the first surface of the base; and
an opaque encapsulant that encases, to prevent propagation of UV light thereto, (i) an entirety of the at least one said voltage-regulation device, and (ii) an entirety of the second epoxy, the opaque encapsulant also coating a portion of the metallization pattern,
wherein the interior volume is substantially free of oxygen.

19. The illumination device of claim 18, wherein a pressure within the interior volume is less than atmospheric pressure.

20. The illumination device of claim 18, wherein the interior volume is substantially filled with nitrogen and/or one or more inert gases.

21. The illumination device of claim 18, wherein at least one of the voltage-regulation devices comprises a zener diode.

22. The illumination device of claim 18, wherein the metallization pattern comprises Ni.

23. The illumination device of claim 18, wherein the light-emitting device comprises a light-emitting diode or a laser.

24. The illumination device of claim 18, wherein the second epoxy is the sole means of attachment of the voltage-regulation device to the base that is disposed between the first surface of the base and the surface of the voltage-regulation device that faces the first surface of the base.

25. The illumination device of claim 18, wherein (i) the at least one said voltage-regulation device is electrically coupled to the metallization pattern by one or more wire bonds, and (ii) the opaque encapsulant coats at least a portion of each said wire bond.

26. The illumination device of claim 18, wherein no wire bonds are connected to the light-emitting device.

27. The illumination device of claim 18, wherein the light-emitting device and the at least one said voltage-regulation device are coplanar within the interior volume.

28. The illumination device of claim 18, further comprising a barrier material disposed between the first epoxy and the interior volume, the barrier material substantially preventing propagation of UV light emitted by the light-emitting device to the first epoxy.

29. The illumination device of claim 28, wherein the barrier material comprises one or more metals.

30. The illumination device of claim 28, wherein the barrier material comprises polytetrafluoroethylene.

31. The illumination device of claim 18, wherein (i) the first surface of the base is the only horizontal surface of the base present within the interior volume, and (ii) the light-emitting device is coupled to the first surface of the base.

32. The illumination device of claim 31, wherein the light-emitting device is electrically coupled only to metallization disposed on the first surface of the base.

\* \* \* \* \*